(12) United States Patent
Choi

(10) Patent No.: US 6,720,206 B2
(45) Date of Patent: Apr. 13, 2004

(54) METHOD FOR MANUFACTURING DIGITAL MICRO-MIRROR DEVICE (DMD) PACKAGES

(75) Inventor: Jong-Kon Choi, Chungcheongnam-do (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/847,620

(22) Filed: May 2, 2001

(65) Prior Publication Data

US 2001/0041381 A1 Nov. 15, 2001

(30) Foreign Application Priority Data

May 10, 2000 (KR) ........................................ 2000-24951

(51) Int. Cl.[7] .................... H01L 21/44; H01L 21/46; H01L 27/19; H01L 21/115
(52) U.S. Cl. .................... 438/114; 438/115; 438/116; 438/460; 438/465; 257/414; 257/430
(58) Field of Search .................... 257/414, 433, 257/704, 779, 459; 438/114, 460, 465, 115, 116, 438, 118, FOR 340, 48, 55, 65, 68, 69, 72

(56) References Cited

U.S. PATENT DOCUMENTS

| | | | | |
|---|---|---|---|---|
| 5,293,511 A | * | 3/1994 | Poradish et al. | 257/434 |
| 5,435,876 A | * | 7/1995 | Alfaro et al. | 156/247 |
| 5,516,728 A | * | 5/1996 | Degani et al. | 438/465 |
| 5,605,489 A | * | 2/1997 | Gale et al. | 451/28 |
| 5,668,405 A | * | 9/1997 | Yamashita | 257/668 |
| 5,923,995 A | * | 7/1999 | Kao et al. | 438/460 |
| 6,063,696 A | * | 5/2000 | Brenner et al. | 438/465 |
| 6,335,224 B1 | * | 1/2002 | Peterson et al. | 438/114 |
| 6,507,082 B2 | * | 1/2003 | Thomas | 257/414 |
| 6,507,098 B1 | * | 1/2003 | Lo et al. | 257/686 |
| 6,542,282 B2 | * | 4/2003 | Smith et al. | 359/291 |
| 2002/0163055 A1 | * | 11/2002 | Thomas | 257/459 |

FOREIGN PATENT DOCUMENTS

| | | | |
|---|---|---|---|
| EP | 0499752 | * | 8/1992 |
| JP | 59-198714 | * | 11/1984 |
| JP | 63-221634 | * | 9/1988 |
| JP | 64-53795 | * | 3/1989 |
| JP | 02-039442 | * | 8/1990 |
| JP | 56-115548 | * | 9/1991 |

* cited by examiner

Primary Examiner—David E. Graybill
Assistant Examiner—James M. Mitchell
(74) Attorney, Agent, or Firm—Marger Johnson & McCollom, P.C.

(57) ABSTRACT

A method for manufacturing a semiconductor package is disclosed. A wafer including a plurality of semiconductor chips is provided. Each chip has one or more mirrors mounted thereon. Further, a plurality of bond pads formed on a periphery of the chip. Next, a photoresist is formed over the one or more mirrors. Then, the semiconductor chips are singulated from the wafer. One ore more semiconductor chips are mounted on a base substrate. The bond pads of the semiconductor chip are electrically connected with the base substrate. The photoresist is then removed from the semiconductor chips.

19 Claims, 12 Drawing Sheets

METHOD FOR MANUFACTURING DIGITAL MICRO-MIRROR DEVICE (DMD) PACKAGES

BACKGROUND OF THE INVENTION

1. Field of the Invention

The present invention relates to a method for manufacturing semiconductor device packages, and more particularly to a method for manufacturing digital micro-mirror device (DMD) packages.

2. Description of the Related Arts

In order to keep pace with the development of personal computers, a display has been developed from a cathode-ray tube type display into a liquid crystal display or a mirror type display. Especially, with the increasing demand for digital broadcasting appliances, a digital light processing (DLP) technology for high resolution becomes more and more important. A DMD, which is an essential component for the DLP technology, requires significant expertise in the manufacturing process for mirrors so that high reliability and low cost in the manufacturing process can be obtained.

The DMD process involves driving the mirrors, and thus the proper driving of mirrors is very important. Further, moisture and dust within the packages affect the picture quality or resolution of the DMD as well as its reliability or durability. Therefore, during the fabrication of the DMD packages, the DMD packages themselves need to be protected from moisture and dust.

FIG. 1 is a plan view showing a conventional semiconductor chip 12 for the DMD, and FIG. 2 is a cross-sectional view showing a DMD package 100 containing the semiconductor chip 12 of FIG. 1. With reference to FIG. 1 and FIG. 2, the semiconductor chip 12 is attached to an upper surface 21 of a base substrate 20 by interposing an Ag-epoxy adhesive 30 therebetween. The semiconductor chip 12 and the base substrate 20 are electrically interconnected to each other with one or more bonding wires 40. In order to protect the semiconductor chip 12 from external environmental stresses, a metal sealing ring 24 with a predetermined height is provided at the periphery of the upper surface 21 of the base substrate 20.

The components, including the semiconductor chip 12, are hermetically sealed up with a window lid 50. A heat sink stud 60 is attached to the lower surface 23 of the base substrate 20. The window lid 50 comprises a metal lid frame 52 contacting the metal sealing ring 24, and a window 54. A reflectance coating film 56 is applied to the lower surface of the window 54 along the periphery thereof. The metal sealing ring 24 and the base substrate 20 form a cavity 29, and a moisture getter (absorbent) 58 is attached to the lower surface of the metal lid frame 52 of the window lid 50 within the cavity 29. External terminals (not shown) are formed on the lower surface 23 of the base substrate 20.

A plurality of mirrors 16 (only a typical one of which is depicted in FIG. 2) are formed on the active surface of the semiconductor chip 12 at the center thereof, and one or more electrode pads 14 are formed on the active surface at the periphery thereof for interconnection via the one or more bonding wires 40.

FIG. 3 is a flow chart 90 describing a manufacturing process of the conventional DMD package 100. Each step of the manufacturing process is described briefly below.

A wafer comprising a plurality of the semiconductor chips 12 is prepared (step 71). Herein, a photoresist film is formed on the upper surface of the wafer in the predetermined portion. The photoresist film prevents damage to the mirrors 16 from the external environment by covering the mirrors 16. The photoresist film is not formed on the electrode pads 14.

Prior to wafer-breaking, the wafer is half-cut (step 72). The photoresist film on the upper surface of the wafer is removed (step 73), and to shield the mirrors 16 from dust or moisture, a first anti-sticking film is formed thereon (step 74). The wafer is broken and separated into individual semiconductor chips 12 (step 75). A breaking means in a dome shape is brought into contact with to the back surface of the wafer and urged upwardly. As a result, the half-cut wafer is broken into a plurality of individual semiconductor chips 12.

The silicon particles generated during the wafer-breaking step are then removed (step 76).

The semiconductor chip 12 is attached to the upper surface 21 of the base substrate 20 by the Ag-epoxy adhesive 30 (step 77), and the Ag-epoxy adhesive 30 is cured (step 78). The semiconductor chip 12 is electrically interconnected to the base substrate 20 with the bonding wires 40 (step 79).

The organic compounds remaining on the upper surface 21 of the base substrate 20, the semiconductor chip 12 on the surface 21, and the bonding wires 40 are removed (step 80). A second anti-sticking film is formed thereon (step 81).

The metal sealing ring 24 is mounted on the upper surface 21 of the base substrate 20, and the components are hermetically sealed by the window lid 50 having the moisture getter 58 attached thereon (step 82).

The heat sink stud 60 is attached to the lower surface 23 of the base substrate 20 (step 83). The DMD package 100 is thus complete.

The above-described method for manufacturing the conventional DMD packages has several problems as follows;

The manufacturing process is very complicated. The major reason is that the manufacturing process for the conventional DMD package employs the wafer-breaking method for separating the wafer into individual semiconductor chips 12. Since the wafer-breaking method comprises a first step of half-cutting the wafer and a second step of breaking the wafer, compared to the full-cutting method, which completely cuts the wafer at once, this method further involves an additional step, i.e. the wafer-breaking step.

Even if the fall-cutting method is employed to prevent this drawback, another problem occurs in the step of removing the photoresist after separating the wafer into the semiconductor chips by the full-cutting method. Conventionally, the wafer comprising separated semiconductor chips has the adhesive tape on its back surface. In the photoresist-removing step after the wafer-cutting step, the adhesive from the adhesive tape and the photoresist are unnecessarily removed together. Thus, the individual semiconductor chips can be undesirably detached from the adhesive tape. Therefore, the conventional manufacturing process normally cannot employ the fall-cutting method.

The mirrors within the semiconductor chip 12 can be easily damaged by the silicon particles generated in the wafer-breaking step. The silicon particles positioned between the mirrors 16 cannot be properly removed by the washing step. Since the wafer-breaking step is carried out after the step of removing the photoresist, damage to the mirrors 16 by the silicon particles commonly occurs.

Since the Ag-epoxy adhesive is used to attach the semiconductor chip 12 to the base substrate 20, moisture enters the package due to the hygroscopicity of the Ag-epoxy. Further, an exhaust gas generated during the curing of the Ag-epoxy adhesive contaminates the mirrors 16 on the active surface of the semiconductor chip 12. Therefore, it is preferable to use solder as the adhesive means. However, with the use of the solder, damage such as the burning of the first anti-sticking film or the deformation of the mirrors can occur. In other words, to attach the semiconductor chip to the base substrate, the solder must be melted at a temperature of 150° C. or more. Such a high temperature causes the burning of the first anti-sticking film or the deformation of the mirrors 16 in the semiconductor chip 12.

SUMMARY OF THE INVENTION

Accordingly, an object of the present invention is to simplify the manufacturing process of the DMD packages.

Another object of the present invention is to prevent failures generated in the sequence of steps including first half-cutting and second full-cutting the wafer.

Still another object of the present invention is to prevent failures due to the use of the Ag-epoxy adhesive.

In order to achieve the foregoing and other objects, a method for manufacturing digital micro-mirror device (DMD) packages comprises preparing a wafer including a plurality of DMD semiconductor chips, each chip having a plurality of mirrors formed on the center of an active surface, a plurality of electrode pads formed on the edges of the active surface, and a photoresist for protecting the mirrors. The method further comprises forming a metallic layer on a back surface of the wafer, said metallic layer being made of a metal having a low melting point. It further comprises separating the wafer into the individual semiconductor chips. It also comprises attaching each semiconductor chip to an upper surface of a base substrate with an adhesive made of a metal having a low melting point. The method then comprises the steps of interconnecting the electrode pads of the semiconductor chip to the base substrate with a bonding wire, removing the photoresist from the semiconductor chips, and forming an anti-sticking film on the active surface of the semiconductor chip for protecting the semiconductor chips from dust and moisture. Finally, the method comprises hermetically sealing the semiconductor chip and the bonding wires on the upper surface of the base substrate by using a window lid.

It is preferable that the metallic layer is made of a metal having a low melting point selected from the group consisting of Va, Au, Ni, Ag, Cu, Al, Pb, Sn, Sb, Pd and metallic compounds thereof.

The step of forming a metallic layer comprises lapping the back surface of the wafer and forming on the back surface a metallic layer made of a metal having a low melting point.

Solder is preferably used as the metal adhesive having a low melting point.

After the step of hermetically sealing the semiconductor chip and the bonding wires, the manufacturing method of the DMD packages further comprises attaching a heat sink stud to the lower surface of the base substrate. Further, it is preferable that the step of hermetically sealing the semiconductor chip and the bonding wires is carried out at a temperature which is no higher than the temperature of the step of attaching the semiconductor chip to the base substrate.

BRIEF DESCRIPTION OF THE DRAWINGS

The various features and advantages of the present invention will be readily understood with reference to the following detailed description taken in conjunction with the accompanying drawings, wherein like reference numerals designate like structural elements, and, in which:

FIG. 6 through FIG. 16 illustrate schematically each step of the manufacturing process in FIG. 5; wherein FIG. 6 is a schematic plan view that illustrates a wafer used in the DMD packages;

FIG. 7 is a plan view that illustrates the manufactured wafer;

FIG. 8 is a cross-sectional view taken along the line 8—8 in FIG. 7;

FIG. 9 is a partial cross-sectional view showing backlapping the wafer;

FIG. 10 is a cross-sectional view that illustrates forming a metal layer on the back surface of the wafer;

FIG. 11 is a cross-sectional view that illustrates cutting the wafer into individual semiconductor chip;

FIG. 12 is a cross-sectional view that illustrates attaching a semiconductor chip to a base substrate;

FIG. 13 is a cross-sectional view that illustrates wire-bonding;

FIG. 14 is a cross-sectional view that illustrates removing the photoresist;

FIG. 15 is a cross-sectional view that illustrates hermetically sealing the package with a window lid; and FIG. 16 is a cross-sectional view that illustrates attaching a heat sink stud on the lower surface of the base substrate.

DETAILED DESCRIPTION OF THE PREFERRED EMBODIMENTS

Preferred embodiments of the present invention will be described below with reference to the accompanying drawings.

Figure 1:
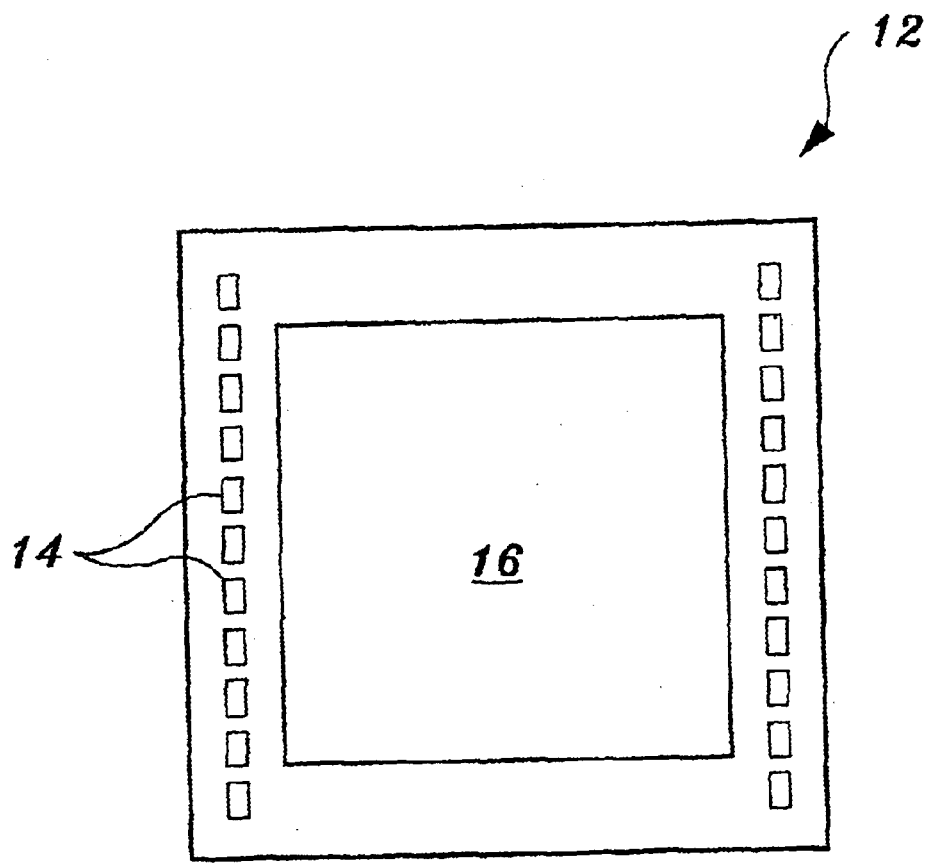
FIG. 1 is a schematic plan view showing a conventional semiconductor chip for digital micro-mirror device (DMD)
Figure 2:
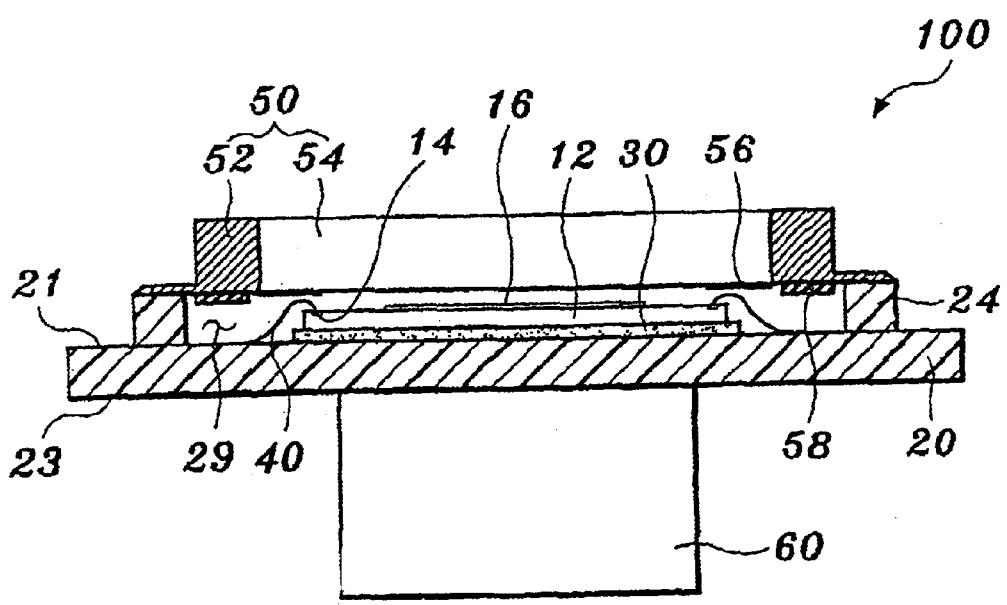
FIG. 2 is a cross-sectional view showing a conventional DMD package containing the semiconductor chip of FIG. 1.
Figure 3:
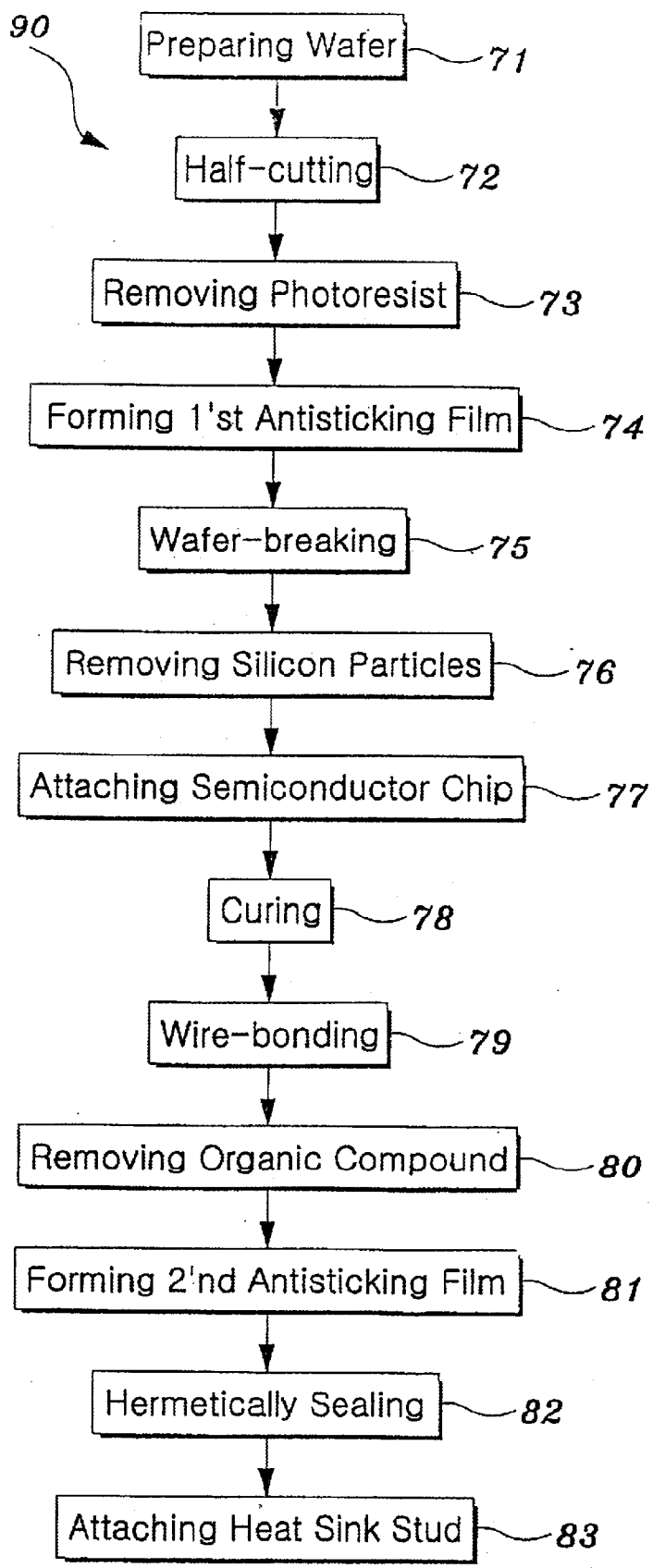
FIG. 3 is a flowchart describing a conventional manufacturing process of the DMD package in FIG. 2.
Figure 4:
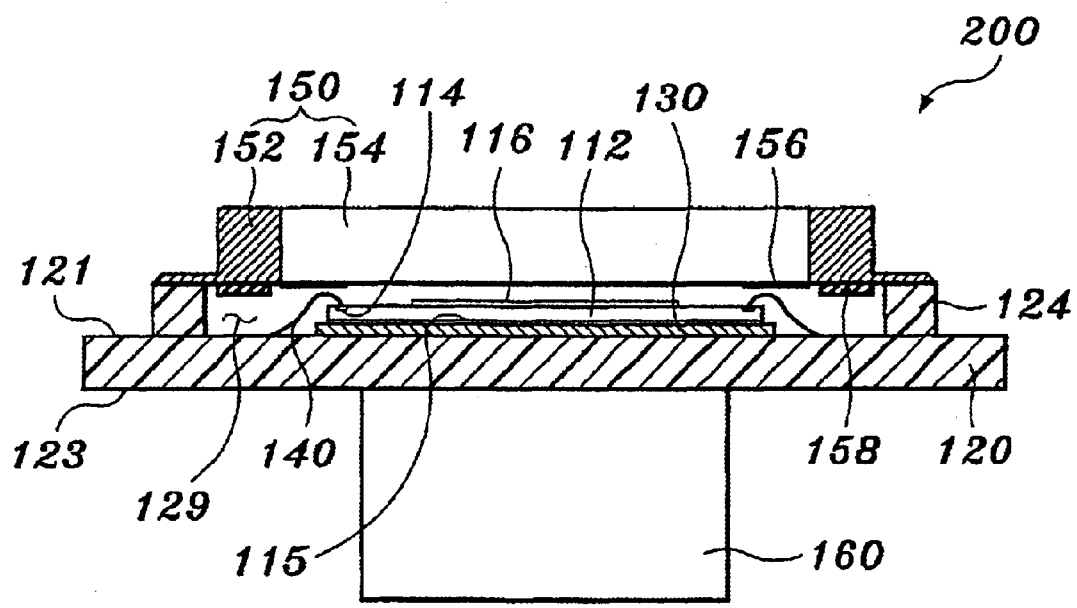
FIG. 4 is a cross-sectional view showing a DMD package in accordance with an embodiment of the present invention.

FIG. 4 is a cross-sectional view showing a DMD package 200 in accordance with an embodiment of the present invention. With reference to FIG. 4, a semiconductor chip 112 is attached to an upper surface 121 of a base substrate 120 with a metallic adhesive 130 having a low melting point, and a metallic layer 115 made of a metal having a low melting point is formed on the back surface of the semiconductor chip 112. The base substrate is preferably a ceramic board, a plastic board, or a printed circuit board. Herein, the metallic layer 115 enables the metallic adhesive 130 to be firmly attached to the semiconductor chip 112. Other components are the same as those of the conventional DMD package 100 of FIG. 1.

Referring to FIGS. 5 through 16, a manufacturing process of the DMD packages in accordance with an embodiment of the present invention is described below.

Figure 5:
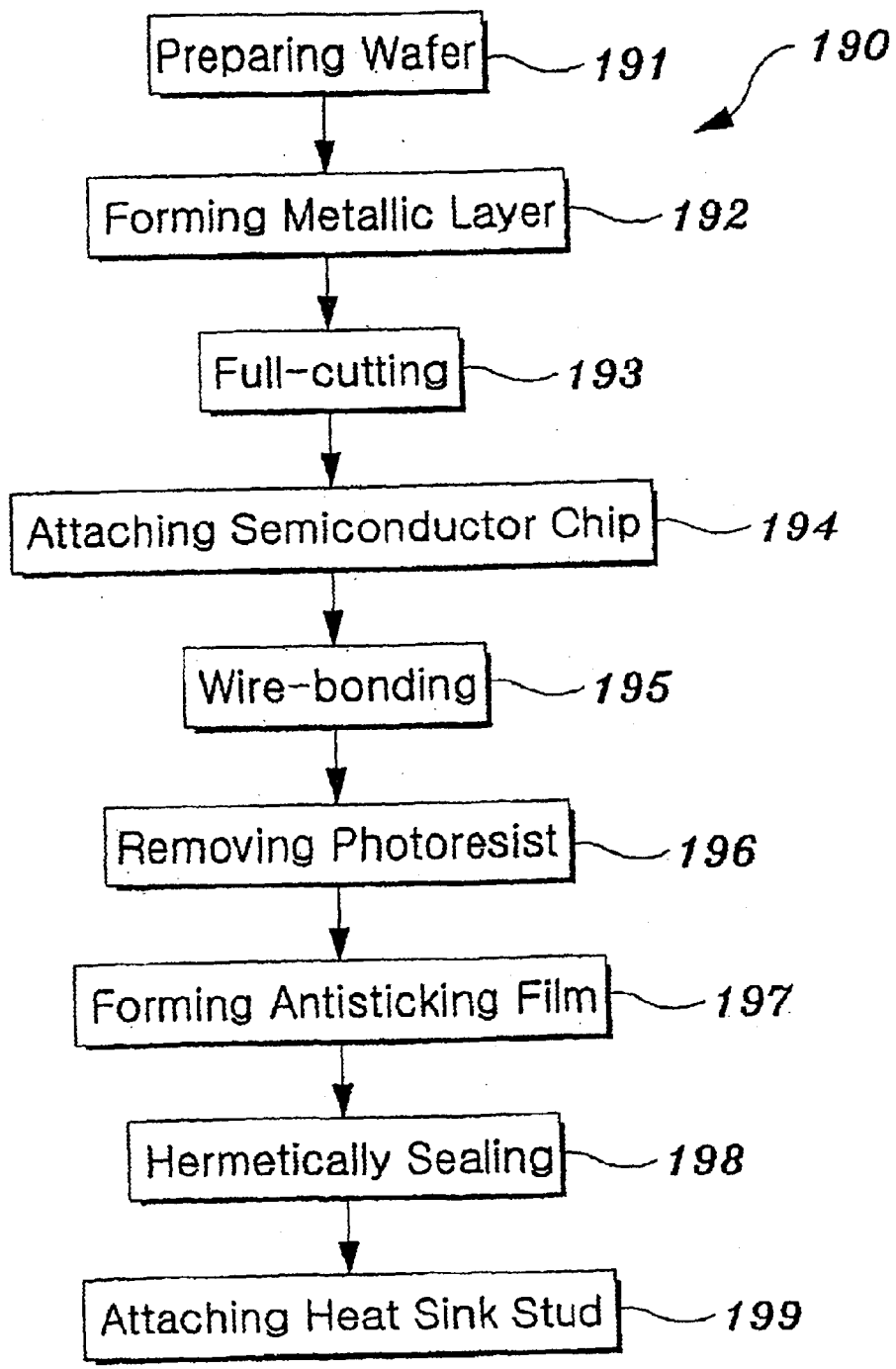
FIG. 5 is a flow chart describing a manufacturing process of the DMD package in FIG. 4.

FIG. 5 is a flow chart 190 illustrating a manufacturing process of the DMD package 200 in FIG. 4. FIGS. 6 through 16 show each step of the manufacturing process of FIG. 5.

Figure 6:
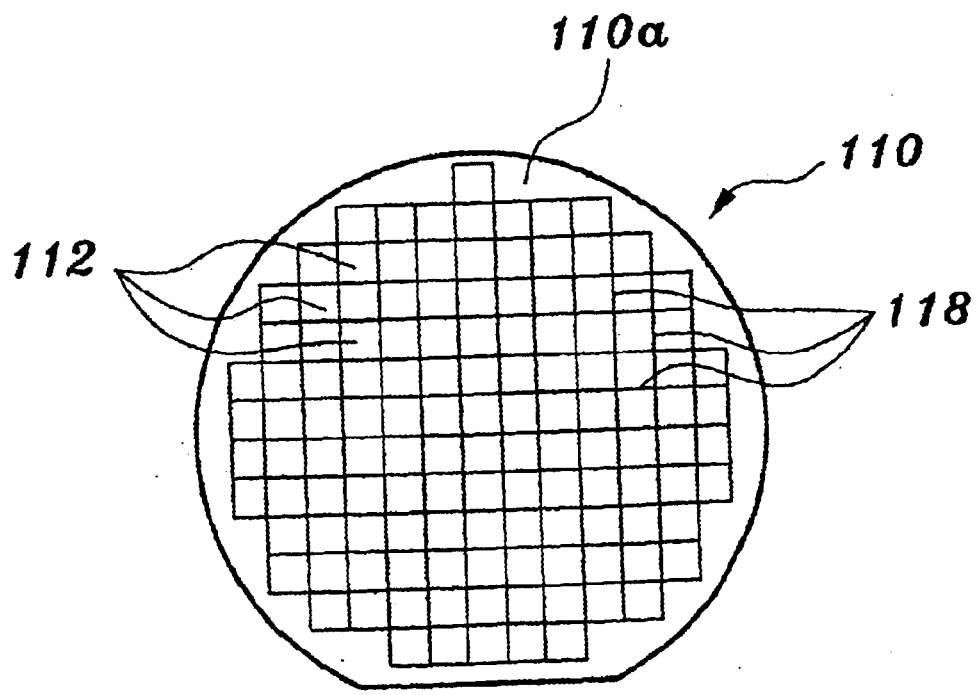
Figure 7:
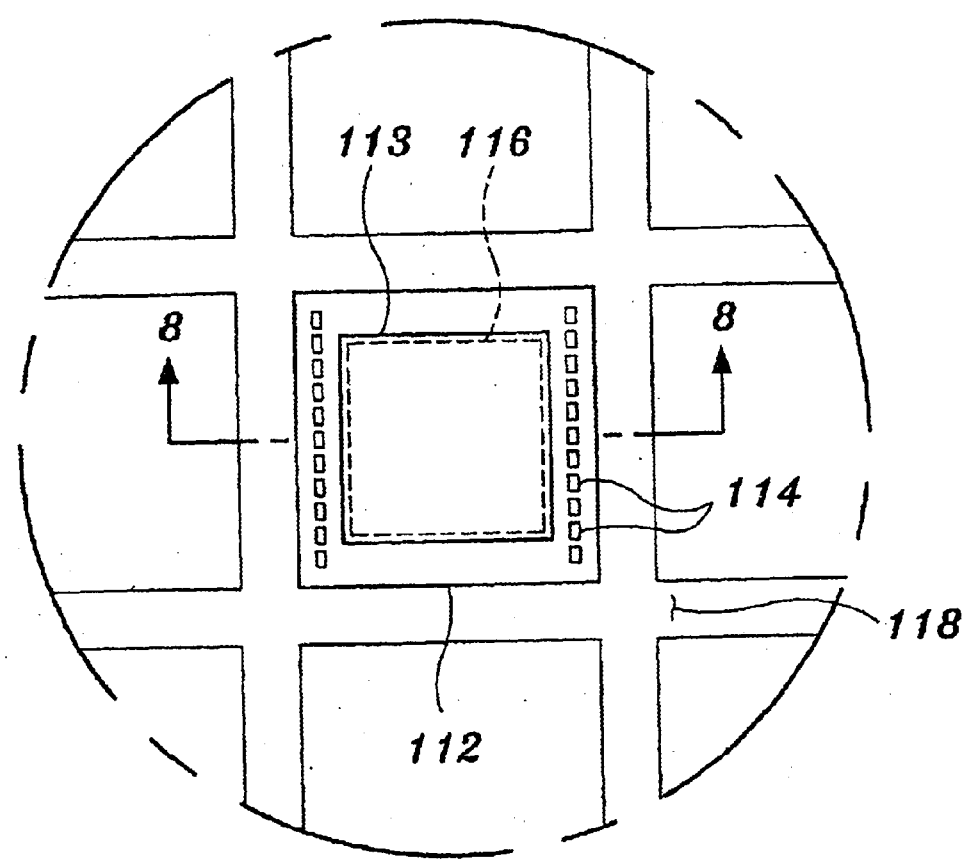
Figure 8:
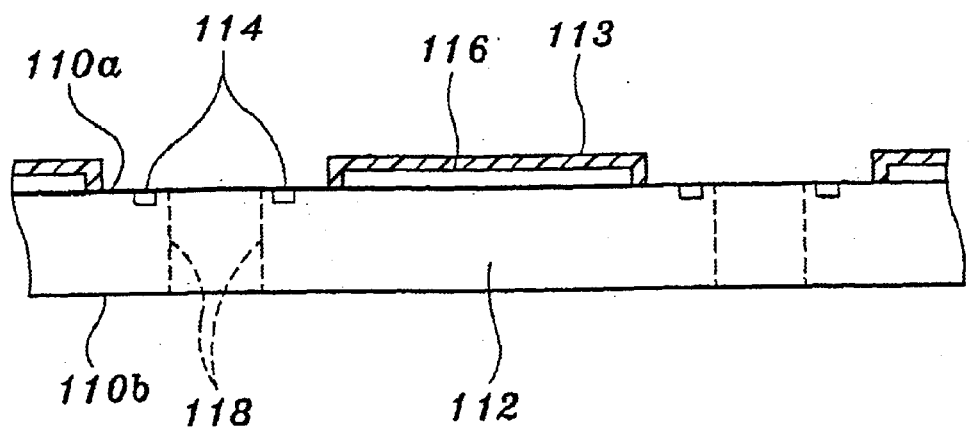

As shown in FIGS. 6 through 8, the manufacturing process starts with preparing the wafer 110 (step 191). The silicon wafer 110 comprises a plurality of mirror-driving integrated circuits (not shown) formed by conventional techniques. A plurality of semiconductor chips 112 are formed on the wafer 110. Scribe lines 118 are also formed between the neighboring semiconductor chips 112, where the circuits are not formed.

The photoresist 113 is formed on a predetermined portion of the upper surface 110a of the wafer 110. The photoresist 113 prevents damage to the mirrors 116 from the external environment. The photoresist 113 is not formed on the electrode pads 114.

Figure 9:
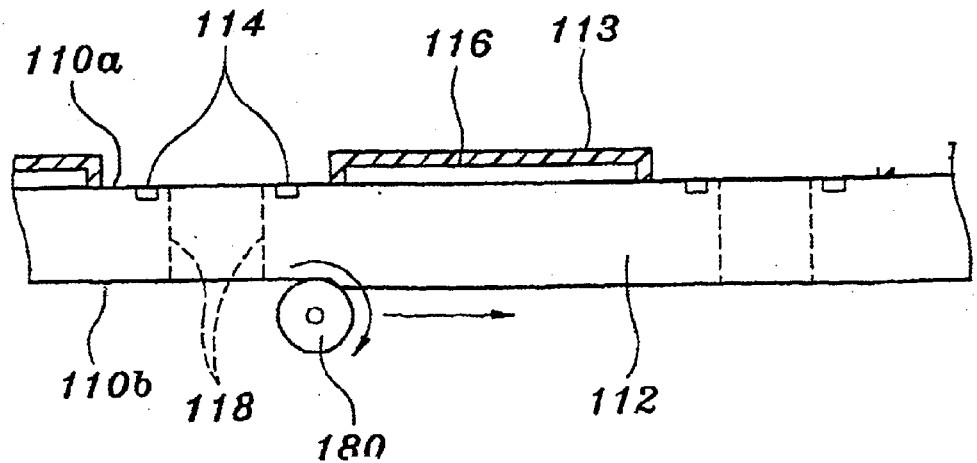

A metallic layer 115 is formed on the back surface 110b of the wafer (step 192). The metallic layer 115 enables the metallic adhesive to be firmly attached to the back surface 110b of the wafer 110. As shown in FIG. 9, the back surface 110b is lapped with a lapping device 180. Because the silicon oxide layer is naturally formed on the back surface of the wafer 110, if the metallic layer is formed on the back surface of the wafer 110 without any treatment, adhesion between the back surface of the wafer 110 and the metallic layer 115 can be undesirably weak.

Figure 10:
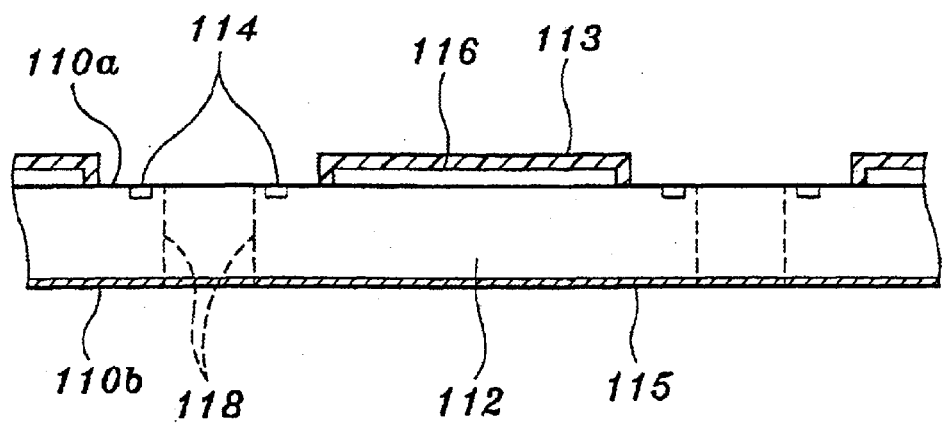

For this reason, in this embodiment, the back surface 110b is lapped with the lapping device 180. However, the back surface may be lapped by any suitable conventional etching techniques. As shown in FIG. 10, the metallic layer 115 is formed on the lapped back surface 110b of the wafer 110. With respect to the adhesive means and the temperature in the chip attachment process, it is preferable to use a metal having a low melting point as the metallic layer 115. For example, the metal can be Va (Vanadium), Au (Gold), Ni (Nickel), Ag (Silver), Cu (Copper), Al (Aluminum), Pb (Lead), Sn (Tin), Sb (Stibium), Pd (Palladium) and metal-containing compounds thereof. Of course, the present invention is not limited to such metals and compounds. Those of ordinary skill in the art should also be aware the other suitable metals or metallic compounds are well within the broad scope of the present invention.

Figure 11:
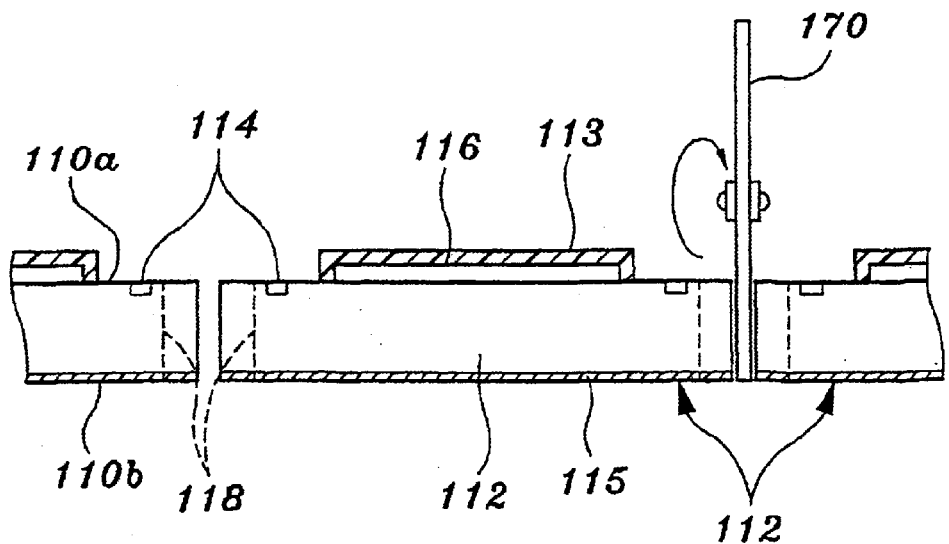

As shown in FIG. 11, the wafer 110 is separated into individual semiconductor chips 112 by the full-cutting method (step 193). A scribe blade 170 saws the wafer 110 along the scribe lines 118 and thereby separates the wafer 110 into individual semiconductor chips 112. This wafer-sawing step is carried out with the wafer 110 having the adhesive tape (not shown) attached to the back surface 110b of the wafer 110. Then, the wafer-washing step is performed.

Since the mirrors 116 of the semiconductor chips 112 are coated with the photoresist 113, damage to the mirrors 116 by contaminants such as silicon particles during the wafer sawing process can be prevented.

Figure 12:
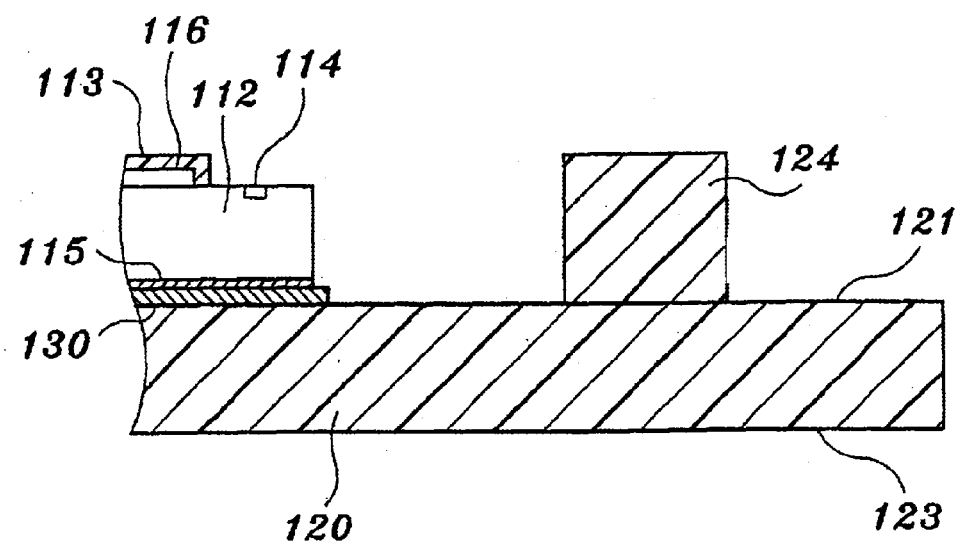

Conventionally, a step of removing the photoresist normally follows the washing step. However, with the conventional method, a delamination problem of the semiconductor chip from the adhesive tape occurs. In order to prevent this problem, in accordance with the embodiment of the present invention, as shown in FIG. 12, a chip attachment step (step 194) is followed. Each of the semiconductor chips 112 is separated from the wafer (110 in FIG. 11), and attached to the upper surface 121 of the base substrate 120 by interposing an adhesive 130 having a low melting point such as solder therebetween. Herein, the adhesive 130 is solidified at room temperature, and therefore the curing step for the Ag-epoxy adhesive is omitted. Since a metallic layer 115 is formed on the back surface of the semiconductor chip 112, the adhesive 130 is more firmly attached to the semiconductor chip 112. The adhesive 130 can be provided in various forms such as a ribbon, paste, wire or any other suitable patterns.

If the adhesive 130 is used, the die-attaching step is carried out at higher temperature than if the Ag-epoxy adhesive is used. For example, with the solder, the die attaching step is processed at a temperature of approximately 150° C. or more. However, since the mirrors 116 of the semiconductor chip are coated with the photoresist 113, although the die-attaching step is carried out at a high temperature, the mirrors 116 of the semiconductor chips are not damaged.

Although this embodiment uses the base substrate 120 having a flat upper surface, other base substrates having a dented upper surface may be used. For the base substrate, however, a ceramic substrate having low hygroscopicity and high thermal conductivity preferably is used, although other plastic substrates or a printed circuit board may be used.

Figure 13:
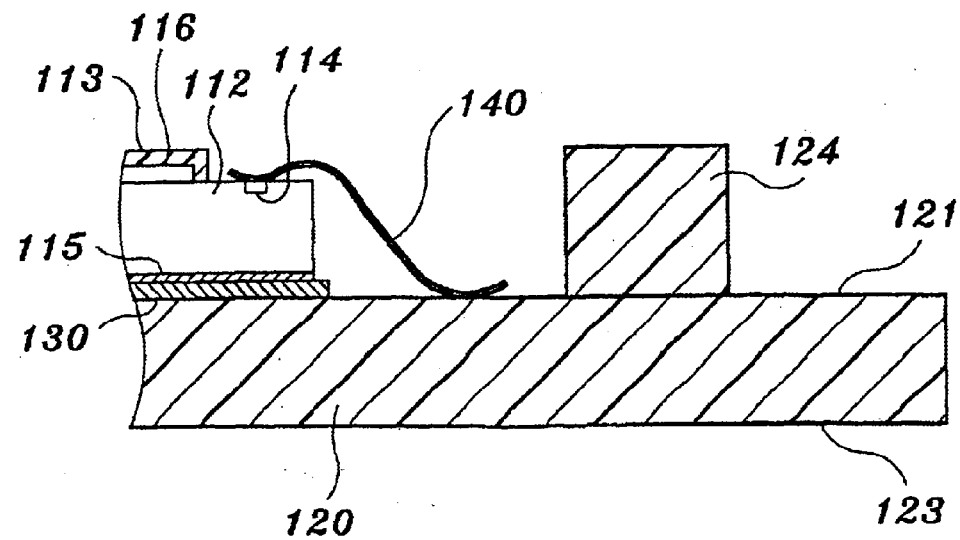

As shown in FIG. 13, the wire-bonding step is carried out (step 195). Herein, the ball-bonding method using an Au bonding wire or the wedge-bonding method using an Al bonding wire may be alternatively employed. FIG. 13 shows the wedge-bonding method between the electrode pads 114 of the semiconductor chip 112 and the base substrate 120.

Figure 14:
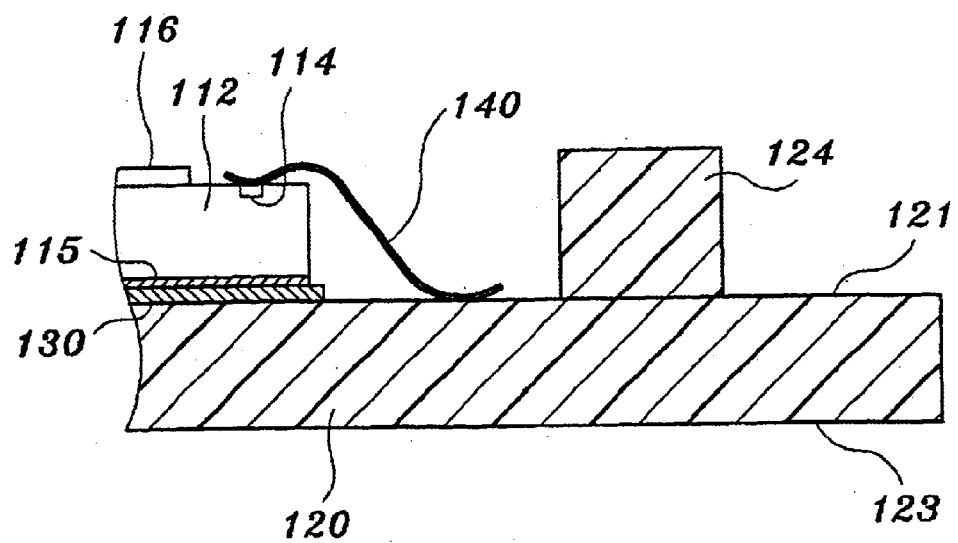

As shown in FIG. 14, the photoresist (113 in FIG. 13) is removed (step 196), and an anti-sticking film is formed (step 197). The photoresist 113 is not removed until after the wire-bonding step. This prevents the contamination of the mirrors 116 due to dust or moisture. However, after the wire-bonding step, the photoresist 113 on the mirrors 116 is removed, because the mirrors 116 in the semiconductor chip 112 are protected from the outside when sealing the components including the semiconductor chip with the window lid. Then, the anti-sticking film for preventing the sticking of dust or moisture is formed.

The photoresist 113 is removed from the semiconductor chip 112 attached to the base substrate 120. The embodiment of the present invention discloses the manufacturing process of the DMD packages, on which a single semiconductor chip 112 is mounted on the base substrate 120. However, it still falls within the spirit and scope of the present invention that a plurality of the semiconductor chips 112 are mounted on the base substrate 120 in rows, and multiple packages are simultaneously manufactured. In such case, the photoresist 113 formed on a plurality of the semiconductor chips 112 are collectively removed.

Figure 15:
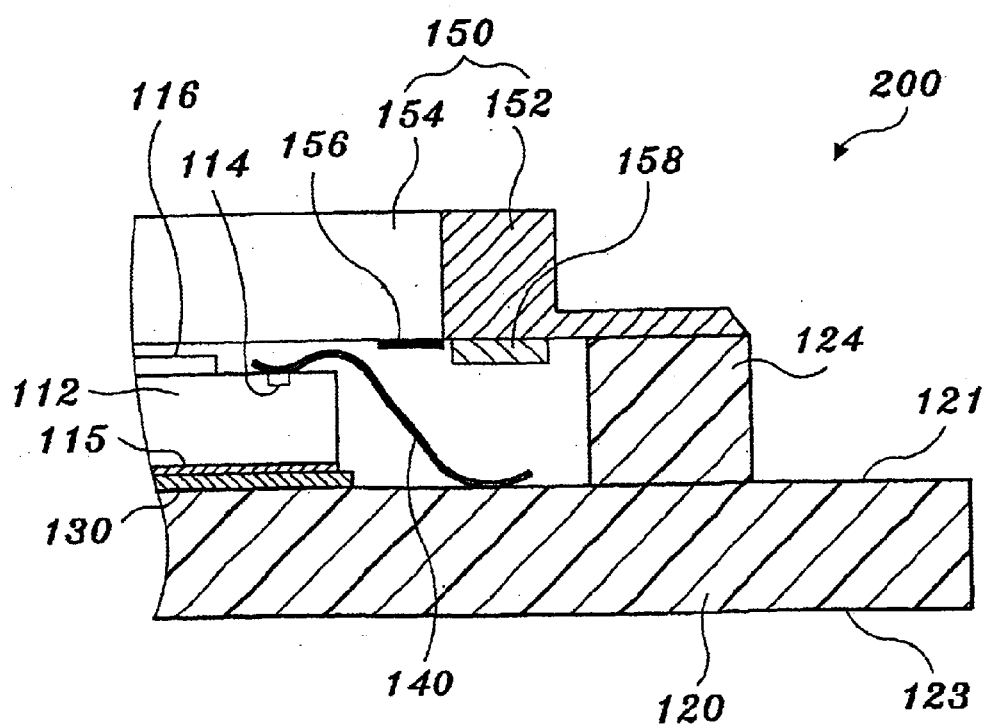

As shown in FIG. 15, the components including the semiconductor chip 112 are hermetically sealed (step 198). In order to protect the semiconductor chip 112 on the base substrate 120 and the bonding wire 140 from the external environment, the semiconductor chip 112 and the bonding wire 140 are hermetically sealed. A window lid 150 is attached to a metal sealing ring 124 on the periphery of the base substrate 120 by thermo-compression, and thereby the cavity (129 in FIG. 4) containing the semiconductor chip 112 is hermetically sealed.

The window lid 150 comprises a metal lid frame 152 in contact with the metal sealing ring 124, and a window 154 perforating the metal lid frame 152 on the center. A reflectance coating film 156 is formed on the lower surface of the window 154 on its periphery, and a moisture getter 158 is attached to a lower surface of the metal lid frame 152.

In order to prevent the bonding wires 140 from contacting the lower surface of the window lid 150 attached to the metal sealing ring 124, it is preferable that a distance between the upper surface of the base substrate 120 and the lower surface of the window lid 150 is greater than the height of the bonding wire.

When the metal lid frame 152 is attached to the metal sealing ring 124 by thermo-compression, a portion of the metal lid frame 152 attached to the metal sealing ring 124 has a thickness less than the thickness of the other portion of the metal lid frame 152. This allows the effective heat transfer from a thermo-compression means through the upper surface of the metal lid frame 152. An adhesive means having a lower melting point than that of the above-described metal adhesive 130 is used between the metal sealing ring 24 and the metal lid frame 152. This prevents the conventional deformation problem that results from re-melting the metal adhesive 130.

Figure 16:
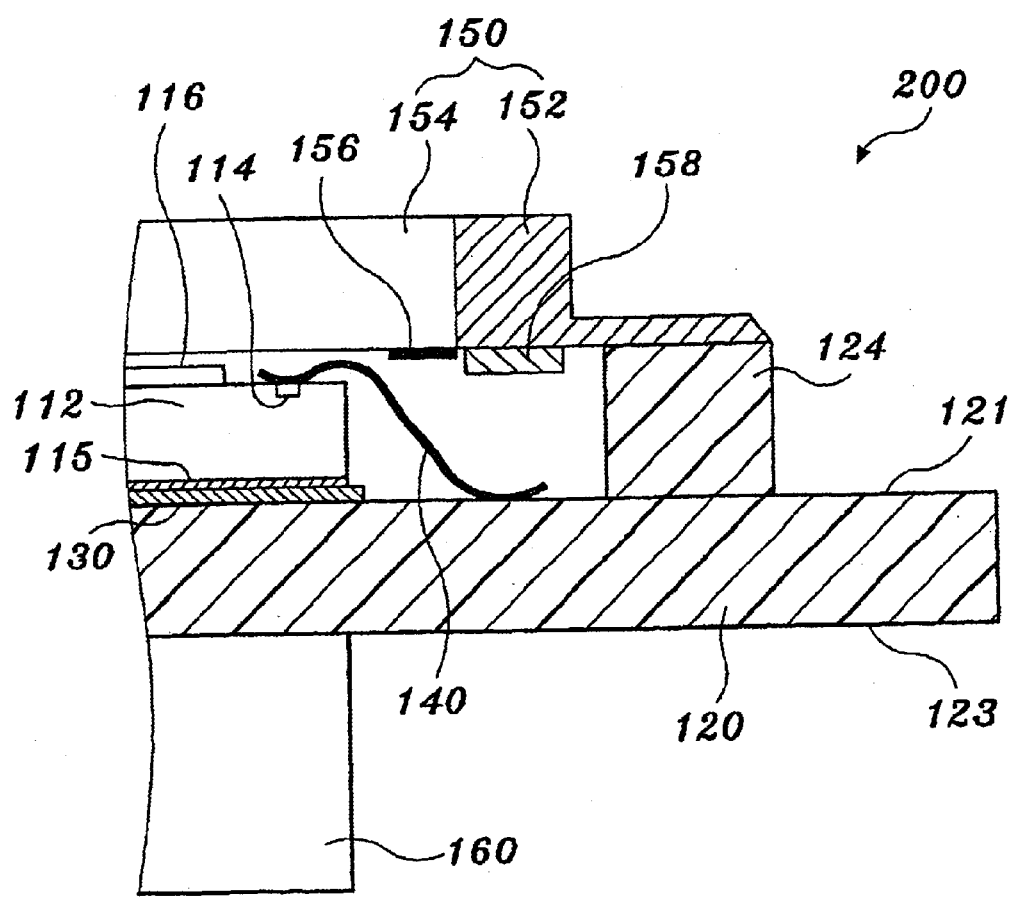

As shown in FIG. 16, the heat sink stud 160 is attached (step 199). In order to effectively draw heat away from heat-generating semiconductor chip 112, the heat sink stud 160 is attached to the lower surface 123 of the base substrate below the semiconductor chip 112. The manufacture of the improved DMD package 200 is complete.

Accordingly, in the manufacturing process of the present invention, since the photoresist is not removed immediately after the separation of the wafer into individual semiconductor chips, but is removed after the wire-bonding step, the present invention simplifies the manufacturing process of the DMD packages as follows:

First, since the wafer is sawed by the full-cutting method, the present invention thus reduces the number of steps required for individual semiconductor chip 112 singulation. Second, because the mirrors 116 of the semiconductor chip 112 are protected with the photoresist 113, the present invention can omit the conventional step of forming the first anti-sticking film. The present invention also omits the conventional step of removing undesirable organic particulate or compounds after the wire-bonding step. During the step for removing the photoresist, the present invention also removes any the organic compounds remaining on the upper surface of the base substrate, the semiconductor chip and the bonding wire.

In the present invention, the mirrors 116 of the semiconductor chip 112 are protected by the photoresist 113. Therefore, instead of the Ag-epoxy adhesive, a metal having a low melting point such as a solder can be used in the chip-attaching step. Although the chip attaching step is carried out at high temperatures, the mirrors 116 formed with the photoresist thereon thus are prevented from high temperature damage (e.g. deformation) that may otherwise occur. Accordingly, the present invention solves the affixation and out-gassing problems described above involving a metal adhesive with a low melting point and an Ag-epoxy adhesive (relating to the hygroscopicity of the Ag-epoxy adhesive and the exhaust gas generated during curing of the Ag-epoxy).

Further, because the photoresist-removing step is performed with the semiconductor chip being mounted on the base substrate 120, it is very easy to handle the inverted DMD semiconductor chip 112.

Although preferred embodiments of the present invention have been described in detail hereinabove, it should be understood that many variations and/or modifications of the basic inventive concepts herein taught which may appear to those skilled in the art will still fall within the spirit and scope of the present invention as defined in the appended claims.

What is claimed is:

1. A method for manufacturing a semiconductor package, said method comprising:

providing a wafer including one or more semiconductor chips, each chip comprising an active surface and a back surface, and having one or more mirrors formed on the active surface and a plurality of bond pads formed of a periphery of the chip;

forming a photoresist over the one or more mirrors;

singulating the one or more semiconductor chips from the wafer;

attaching the back surface of the one or more semiconductor chip to a top surface of a base substrate;

electrically interconnecting the bond pads of the semiconductor chip to the base substrate; and removing the photoresist from the semiconductor chips after the electrically interconnecting the bond pads to the base substrate.

2. The method of claim 1, wherein said forming the full-cutting the wafer.

3. The method of claim 1, after said forming the photoresist, further comprising:

forming a metallic layer over a back surface of the wafer, wherein said attaching is performed using a metallic adhesive.

4. The method of claim 1, further comprising:

hermetically sealing each attached semiconductor chip on the upper surface of the base substrate.

5. A method for manufacturing digital micro-mirror device (DMD) packages, said method comprising:

providing a wafer including a plurality of DMD semiconductor chips, each chip comprising an active surface and a back surface and having one or more mirrors formed on substantially the center of the active surface of the chip, a plurality of electrode pads formed on the periphery of the active surface;

forming a photoresist over the mirrors;

forming a metallic layer on a back surface of the wafer;

separating the wafer into the individual semiconductor chips;

attaching the back surface of each semiconductor chip to an upper surface of a base substrate using a metallic adhesive;

interconnecting the electrode pads of the semiconductor chip to the base substrate with one or more bonding wires;

removing the photoresist from the semiconductor chips after interconnecting the electrode pads to the base substrate;

forming an anti-sticking film on the active surface of the semiconductor chip for protecting the semiconductor chips from dust and moisture; and hermetically sealing the semiconductor chip and the bonding wires on the upper surface of the base substrate.

6. The method of claim 5, wherein the metallic layer is made of a metal having a low melting point, said metal being selected from the group consisting of Va, Au, Ni, Ag, Cu, Al, Pb, Sn, Sb, Pd and metal-containing compounds thereof.

7. The method of claim 5, wherein the base substrate is selected from the group consisting of a ceramic board, a plastic board and a printed circuit board.

8. The method of claim 5, wherein said forming a metallic layer comprises lapping the back surface of the wafer and forming the metallic layer made of a metal having a low melting point on the back surface.

9. The method of claim 5, wherein said metallic adhesive is solder.

10. The method of claim 5, wherein said hermetically sealing of the semiconductor chip and the bonding wires comprises providing a metal sealing ring to the base substrate on a periphery of the base substrate and hermetically sealing the semiconductor chip and the bonding wires by attaching a window lid to the upper surface of the metal sealing ring, and wherein a distance between the upper surface of the base substrate and the lower surface of the window lid is greater than the height of the one or more bonding wires.

11. The method of claim 10, wherein said window lid comprises a metal lid frame in contact with the metal sealing ring, a window perforating the metal lid frame generally in the center of said window lid, a reflectance coating film formed on the lower surface of the window on a periphery thereof, and a moisture getter attached to lower surface of the metal lid frame.

12. The method of claim 5, after said hermetically sealing the semiconductor chip and the one or more bonding wires, which further comprises attaching a heat sink stud to the lower surface of the base substrate.

13. The method of claim 5, wherein said hermetically sealing the semiconductor chip is performed at a predetermined temperature, said predetermined temperature being not higher than the temperature on which said attaching the semiconductor chip to the base substrate is performed.

14. A method for manufacturing a semiconductor package, said method comprising:

provide a wafer including one or more semiconductor chips, each chip comprising an active surface and a back surface and having one or more mirrors and electrodes formed on the active surface;

coating the one or more mirrors with a photoresist film;

singulating the one or more semiconductor chips from the wafer;

attaching the back surface of the one or more semiconductor chip to a top surface of a base substrate using a metallic adhesive;

electrically interconnecting the electrodes of the semiconductor chip to the base substrate; and removing the coated photoresist film from the one or more mirrors of the semiconductor chips after the interconnection.

15. The method of claim 14, after said coating the photoresist film, further comprising:

forming a metallic layer over a back surface of the wafer.

16. The method of claim 14, wherein said metallic adhesive is solder.

17. The method of claim 14, wherein the electrically interconnecting comprises wire bonding.

18. A method for manufacturing a semiconductor package, said method comprising:

providing a wafer including one or more semiconductor chips, each chip comprising an active surface and a back surface, and having one or more mirrors formed on the active surface and a plurality of bond pads formed on a periphery of the chip;

forming a photoresist over the one or more mirrors;

forming a metallic layer over a back surface of the wafer;

singulating the one or more semiconductor chips from the wafer;

attaching the back surface of the one or more semiconductor chip to a top surface of a base substrate using a metallic adhesive;

electrically interconnecting the bond pads of the semiconductor chip to the base substrate; and removing the photoresist from the semiconductor chips after the electrically interconnecting the bond pads to the base substrate.

19. A method for manufacturing digital micro-mirror device (DMD) packages, said method comprising:

providing a wafer including a plurality of DMD semiconductor chips, each chip comprising an active surface and a back surface and having one or more mirrors formed on substantially the center of the active surface of the chip, a plurality of electrode pads formed on the periphery of the active surface;

forming a photoresist over the mirrors;

forming a metallic layer on a back surface of the wafer;

separating the wafer into the individual semiconductor chips;

attaching the back surface of each semiconductor chip to an upper surface of a base substrate using a metallic adhesive;

interconnecting the electrode pads of the semiconductor chip to the base substrate with one or more bonding wires;

removing the photoresist from the semiconductor chips after interconnecting the electrode pads to the base substrate;

forming an anti-sticking film on the active surface of the semiconductor chip for protecting the semiconductor chips from dust and moisture; and hermetically sealing the semiconductor chip and the bonding wires on the upper surface of the base substrate at a predetermined temperature not higher than the temperature on which said attaching the semiconductor chip to the base substrate is performed.

* * * * *

UNITED STATES PATENT AND TRADEMARK OFFICE
CERTIFICATE OF CORRECTION

PATENT NO. : 6,720,206 B2
DATED : April 13, 2004
INVENTOR(S) : Choi

It is certified that error appears in the above-identified patent and that said Letters Patent is hereby corrected as shown below:

Column 7,
Line 8, "sealing ring 24 and" should read -- sealing ring 124 and --.

Column 8,
Line 14, "said forming the full-cutting" should read -- said singulating comprises full-cutting --.

Signed and Sealed this

First Day of February, 2005

JON W. DUDAS
*Director of the United States Patent and Trademark Office*